(12) United States Patent
Wang et al.

(10) Patent No.: US 9,660,582 B2
(45) Date of Patent: *May 23, 2017

(54) SPIN CURRENT GENERATION WITH NANO-OSCILLATOR

(71) Applicant: Regents of the University of Minnesota, Minneapolis, MN (US)

(72) Inventors: Jian-Ping Wang, Shoreview, MN (US); Mahdi Jamali, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/241,169

(22) Filed: Aug. 19, 2016

(65) Prior Publication Data

US 2016/0359458 A1   Dec. 8, 2016

Related U.S. Application Data

(62) Division of application No. 14/540,701, filed on Nov. 13, 2014, now Pat. No. 9,425,738.

(51) Int. Cl.

| H01L 43/08 | (2006.01) |
|---|---|
| G11B 5/39 | (2006.01) |
| H03B 15/00 | (2006.01) |
| H03K 19/18 | (2006.01) |
| G11C 11/16 | (2006.01) |
| G11C 19/08 | (2006.01) |
| H01F 10/32 | (2006.01) |

(Continued)

(52) U.S. Cl.
CPC .......... *H03B 15/006* (2013.01); *G11C 11/161* (2013.01); *G11C 11/1673* (2013.01); *G11C 11/1675* (2013.01); *G11C 19/0808* (2013.01); *G11C 19/0841* (2013.01); *H01F 10/3254* (2013.01); *H01L 43/08* (2013.01); *H03K 19/16* (2013.01); *H03K 19/18* (2013.01); *B82Y 25/00* (2013.01); *G11B 5/3909* (2013.01); *G11B 5/3958* (2013.01); *G11B 2005/3996* (2013.01)

(58) Field of Classification Search
None
See application file for complete search history.

(56) References Cited

U.S. PATENT DOCUMENTS 9,425,738 B2 * 8/2016 Wang et al. ......... H03B 15/006
2010/0075599 A1   3/2010 Xi et al.

(Continued)

OTHER PUBLICATIONS

Ando et al., "Electrically Tunable Spin Injector Free from the Impedance Mismatch Problem," Nature Materials, vol. 10, Jun. 26, 2011, 7 pp.

(Continued)

*Primary Examiner* — Craig A. Renner
(74) *Attorney, Agent, or Firm* — Shumaker & Sieffert, P.A.

(57) ABSTRACT

A device including a spin channel to transport a spin current, a nano-oscillator, and a magnetoresistive device that receives the spin current from the nano-oscillator. The nano-oscillator includes a magnetization state that oscillates between a first state and a second state in response to an input voltage or current. The oscillation of the nano-oscillator may induce the spin current within the spin channel. The magnetoresistive device includes a magnetization state that is set based at least in part on the received spin current.

10 Claims, 9 Drawing Sheets

(51) Int. Cl.
*H03K 19/16* (2006.01)
*B82Y 25/00* (2011.01)

(56) References Cited

U.S. PATENT DOCUMENTS

| | | | |
|---|---|---|---|
| 2010/0097730 | A1 | 4/2010 | Asatani |
| 2014/0036387 | A1 | 2/2014 | Sato et al. |
| 2014/0132257 | A1 | 5/2014 | Sugano et al. |
| 2014/0204487 | A1 | 7/2014 | Hase et al. |
| 2016/0142012 | A1 | 5/2016 | Wang et al. |

OTHER PUBLICATIONS

Ando et al., "Angular Dependence of Inverse Spin-Hall Effect Induced by Spin Pumping Investigated in a Ni81Fe19/Pl Thin Film," Physical Review B, vol. 78, No. 7, Jul. 8, 2008, 6 pp.

Ando et al., "Observation of the Inverse Spin Hall Effect in Silicon," Nature Communications, Jan. 17, 2012, 6 pp.

Awschalom et al., "Challenges for Semiconductor Spintronics," Nature Physics, vol. 3, Mar. 2007, 9 pp.

Behin-Aein et al., "Proposal for an All-Spin Logic Device with Built-In Memory," Nature Nanotechnology, vol. 5, Feb. 28, 2010, 7 pp.

Burrowes et al., "Enhanced Spin Pumping at Yttrium Iron Garnet/Au Interfaces," Applied Physics Letters, vol. 100, No. 9, Mar. 1, 2012, 5 pp.

Chappert et al., "The Emergence of Spin Electronics in Data Storage," Nature Materials, vol. 6, Nov. 2007, 11 pp.

Costache et al., "Electrical Detection of Spin Pumping due to the Precessing Magnetization of a Single Ferromagnet," Physical Review Letters, vol. 97, Nov. 24, 2006, 6 pp.

Hayakawa, "Effect of High Annealing Temperature on Giant Tunnel Magnetoresistance Ratio of CoFeB/MgO/CoFeB Magnetic Tunnel Junctions," Applied Physics Letters, vol. 89, No. 23, Dec. 4, 2006, 4 pp.

Ikeda et al., "A Perpendicular-Anisotropy CoFeB—MgO Magnetic Tunnel Junction," Nature Materials, vol. 9, Jul. 11, 2010, 6 pp.

Inoue et al., "Detection of Pure Inverse Spin-Hall Effect Induced by Spin Pumping at Various Excitation," Journal of Applied Physics, vol. 102, No. 8, Oct. 2007, 5 pp.

Jedema et al., "Electrical Spin Injection and Accumulation at Room Temperature in an All-Metal Mesoscopic Spin valve," Nature, vol. 410, Mar. 15, 2001, 5 pp.

Kalarickal et al., "Ferromagnetic Resonance Linewidth in Metallic Thin Films: Comparison of Measurement Methods," Journal of Applied Physics, vol. 99, No. 9, May 15, 2006, 9 pp.

Kimura et al., "Room-Temperature Reversible Spin Hall Effect," Physical Review Letters, vol. 98, Apr. 12, 2007, 6 pp.

Lee et al, "Spin Pumping in Co56Fe24B20 Multilayer Systems," Journal of Physics D: Applied Physics, vol. 41, No. 21, Nov. 7, 2008, 6 pp.

Liu et al., "Spin-Torque Switching with the Giant Spin Hall Effect of Tantalum," Science, vol. 336, May 4, 2012, 6 pp.

Ohno et al., "Electrical Spin Injection in a Ferromagnetic Semiconductor Heterostructure," Nature, vol. 402, Dec. 1999, 4 pp.

Qiu et al., "All-Oxide System for Spin Pumping," Applied Physics Letters, vol. 100, Jan. 9, 2012, 4 pp.

Saitoh et al., "Coversion of Spin Current into charge Current at Room Temperature: Inverse Spin-Hall Effect," Applied Physics Letters, vol. 88, No. 18, May 5, 2006, 4 pp.

Schmidt et al., "Fundamental Obstacle for Electrical Spin Injection from a ferromagnetic Metal into a Diffusive Semiconductor," Physical Review B, vol. 62, No. 8, Aug. 15, 2000, 6 pp.

Wolf et al., "Spintronics: A Spin-Based Electronics Vision for the Future," Science, vol. 294, Nov. 16, 2001, 10 pp.

Zutic, "Spintronics: Fundamentals and Applications," Reviews of Modern Physics, vol. 76, Apr. 23, 2004, 89 pp.

Prosecution History from U.S. Appl. No. 14/540,701, dated Apr. 20, 2015 through Apr. 20, 2016, 70 pp.

Allwood et al., "Magnetic Domain-Wall Logic," Science, vol. 309, No. 5741, Sep. 9, 2005, 7 pp.

Bandyopadhyay et al., "Electron spin for classical information processing: a brief survey of spin-based logic devices, gates and circuits," Nanotechnology, vol. 20, No. 41, Oct. 14, 2009, 37 pp.

Cowburn et al., "Room Temperature Magnetic Quantum Cellular Automata," Science, vol. 287, No. 5451, Feb. 25, 2000, 4 pp.

Jamali et al., "Spin wave nonreciprocity for logic device applications," Scientific Reports, vol. 3, Nov. 7, 2013, 5 pp.

Jamali et al., "Precessional magnetization induced spin current from CoFeB into Ta," Applied Physics Letters, vol. 103, Dec. 19, 2013, 7 pp.

Lyle et al., "Direct communication between magnetic tunnel junctions for nonvolatile logic fan-out architecture," Applied Physics Letters, vol. 97, No. 15, Oct. 11, 2010, 5 pp.

Meng et al., "A Spintronics Full Adder for Magnetic CPU," IEEE Electron Device Letters, vol. 26, No. 6, Jun. 2005, 5 pp.

Moore, "Topological Insulators: The next generation," Nature Physics, vol. 5, No. 6, Jun. 2009, 6 pp.

Mosendz et al., "Quantifying Spin Hall Angles from Spin Pumping: Experiments and Theory," Physical Review Letters, vol. 104, Jan. 28, 2010, 6 pp.

Ney et al., "Programmable computing with a singe magnetoresistive element," Nature, vol. 425, Oct. 2, 2003, 4 pp.

Rippard et al., "Direct-Current Induced Dynamics in Co90Fe10/Ni80Fe20 Point Contacts," Physical Review Letters, vol. 92, No. 2, Jan. 15, 2004, 6 pp.

Shiota et al., "Pulse voltage-induced dynamic magnetization switching in magnetic tunneling junctions with high resistance-area product," Applied Physics Letters, vol. 101, No. 10, Sep. 5, 2012, 6 pp.

Wang et al., "Electric-field-assisted switching in magnetic tunnel junctions," Nature Materials, vol. 11, Nov. 13, 2011, 7 pp.

Zeng et al., "Ultralow-current-density and bias-field-free spin-transfer nano-oscillator," Scientific Reports, vol. 3, Mar. 12, 2013, 5 pp.

Zhang et al., "High power and low critical current spin torque oscillation from a magnetic tunnel junction with a built-in hard axis polarizer," Applied Physics Letters, vol. 100, No. 3, Jan. 19, 2012, 6 pp.

Fukuma et al., "Giant enhancement of spin accumulation and long-distance spin precession in metallic lateral spin valves," Nature Materials, vol. 10, Jun. 12, 2011, 7 pp.

\* cited by examiner

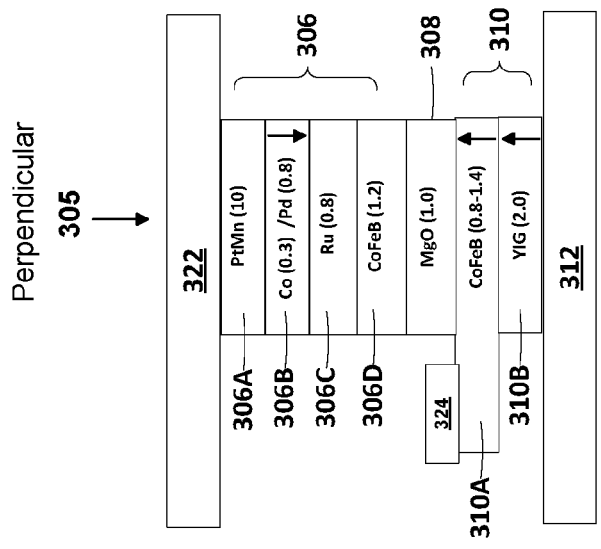
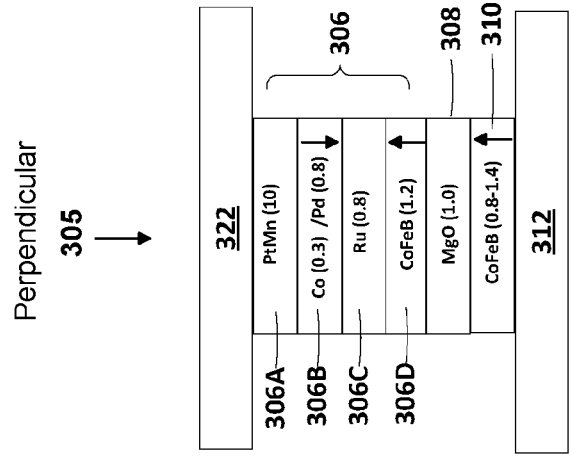
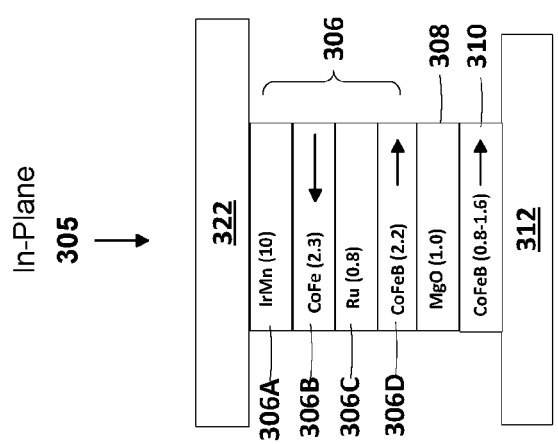

SPIN CURRENT GENERATION WITH NANO-OSCILLATOR

This application is a divisional of U.S. patent application Ser. No. 14/540,701, filed Nov. 13, 2014, the entire content of which is incorporated herein by reference.

GOVERNMENT INTEREST

This invention was made with government funds under Agreement No. HR0011-13-3-0002 awarded by DARPA. The U.S. Government has rights in this invention.

TECHNICAL FIELD

The disclosure relates to spin pumping to generate spin current in a spin-based system.

BACKGROUND

In spin-based systems, a spin-polarized current is used to set magnetization states of magnetoresistive devices. For example, through the spin-transfer torque (STT) effect, spin of electrons in a spin-polarized current can apply torque to a magnetic moment of a free layer in a magnetoresistive device (e.g. a magnetic tunneling junction (MTJ), a giant magnetoresistive (GMR) device). Electrons are spin polarized by the fixed layer of the magnetoresistive device. Depending on the electron flow direction and relative orientation of spin of electrons and the magnetization of the free layer, magnetization of the free layer can be set to be parallel or anti-parallel to the magnetization of the fixed layer.

One way to generate the spin-polarized current for setting magnetization states of magnetoresistive devices is through spin pumping. In spin pumping, a device injects a spin-polarized current into a spin channel, and the spin-polarized current drifts through the spin channel to one or more magnetoresistive devices, and sets the magnetization states of the one or more magnetoresistive devices.

SUMMARY

The disclosure describes example techniques for spin pumping to generate a spin-polarized current with a spin transfer torque (STT) nano-oscillator to set magnetization states of one or more magnetoresistive devices. The nano-oscillator is a type of a magnetoresistive device with a magnetic layer whose magnetization state oscillates around a specific axis (determined by the effective magnetic field) in response to a current flowing through the nano-oscillator. The oscillation of the magnetic layer of the nano-oscillator induces a spin-polarized current in a spin channel through spin pumping. A drift force causes the spin-polarized current to flow through the spin channel to one or more magnetoresistive devices coupled to the spin channel, and the spin-polarized current sets the magnetization state of the magnetoresistive devices.

In some examples, the spin pumping injects the spin-polarized current directly into the spin channel, which reduces or eliminates the loss of spin current caused by the impedance mismatch between the magnet and the spin channel, as compared other spin injection methods like lateral spin valve devices. Moreover, the nano-oscillator, as described in this disclosure, may be scalable and tunable allowing for wider application as compared some other techniques that rely on a coplanar waveguide, with limited scalability, for spin pumping.

In one example, the disclosure describes a device including a spin channel to transport a spin current, and a nano-oscillator having a magnetization state that, in response to an input voltage or current, oscillates between a first state and a second state and induces the spin current within the spin channel. The device also includes a magnetoresistive device that receives the spin current from the nano-oscillator, the magnetoresistive device having a magnetization state that is set by the received spin current.

In one example, the disclosure describes a method for generating a spin current and setting a magnetization state of a magnetoresistive device. The method includes applying an input voltage or current to a nano-oscillator to oscillate a magnetization state of the nano-oscillator between a first state and a second state and induce a spin current in a spin channel coupled to the nano-oscillator. The method further includes setting, in response to the spin current, a magnetization state of a magnetoresistive device coupled to the spin channel.

In one example, the disclosure describes a logic device including a spin channel to transport a spin current, and a nano-oscillator having a magnetization state that, in response to an input voltage or current, oscillates between a first state and a second state and induces the spin current within the spin channel. The logic device also includes a magnetoresistive device that receives the spin current from the nano-oscillator, the magnetoresistive device having a magnetization state that is set based at least in part on the received spin current, and a controller configured to measure the resistivity of the magnetoresistive device and output a voltage or current.

In some examples, the disclosure describes a method for generating and amplifying a spin current. The method includes applying an input voltage or current to a nano-oscillator to oscillate a magnetization state of the nano-oscillator between a first state and a second state and induce a spin current in a spin channel coupled to the nano-oscillator, applying a gate voltage or current to the spin-channel to amplify an input current received by the spin channel with the spin current, and outputting the amplified current.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIGS. 3A-3C are block diagrams illustrating an example of a nano-oscillator in accordance with one or more aspects of the present disclosure.

DETAILED DESCRIPTION

Figure 1:
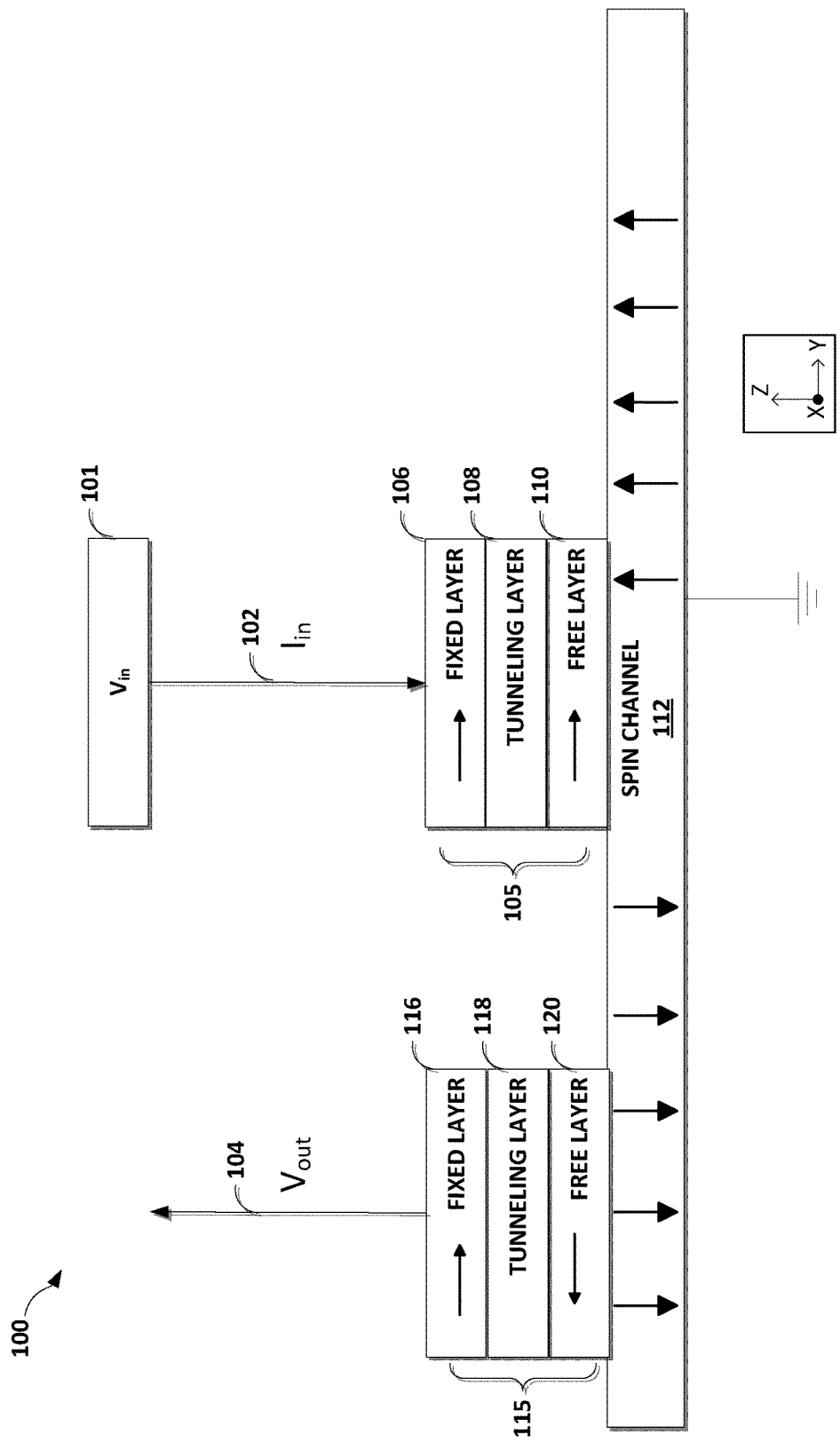
FIG. 1 is a block diagram illustrating an example of a spin logic device in accordance with one or more aspects of the present disclosure.

In spintronic systems, an input device sets the magnetization state of one or more output magnetoresistive devices. In some examples, the magnetization state represents a digital bit value (e.g., a parallel state or low resistance state represents a digital zero and an anti-parallel state of a high resistance state represents a digital one, or vice-versa). The digital value represented by the magnetization state of the magnetoresistive devices may be considered as an output, and in this sense, the magnetoresistive devices may be considered as output devices.

Spin pumping is one example way in which an input device sets the magnetization state of the one or more magnetoresistive devices. In spin pumping, the input device is coupled to a spin channel, and the one or more magnetoresistive devices are also coupled to the spin channel. The input device injects (or outputs) a spin-polarized current into the spin channel, and the one or more magnetoresistive devices receive the spin-polarized current. The spin-polarized current sets the magnetization state of the magnetoresistive devices based on the spin state of the electrons of the spin-polarized current. For instance, if the spin state of the electrons is a first (e.g., up) spin state, then the spin-polarized current sets the magnetization state of the magnetoresistive devices to a first (e.g., up) state, and if the spin state of the electrons is a second (e.g., down) spin state, then the spin-polarized current sets the magnetization state of the magnetoresistive devices to a second (e.g., down) state.

As described in more detail below, in the techniques described this disclosure, the input device that generates the spin-polarized current may be a type of a magnetoresistive device referred to as a Spin Transfer Torque (STT) nano-oscillator. The nano-oscillator may include a single magnetic layer, which may include a plurality of magnetic sub-layers. The nano-oscillator may include two magnetic layers that sandwich a non-magnetic layer (e.g., an insulator layer), where the magnetic direction of one of the magnetic layers is fixed (referred to as the fixed layer), and the magnetic direction of the other magnetic layer can be set (referred to as the free layer). One of the characteristics of the nano-oscillator may be that, in response to application of a voltage or current, the magnetic direction of the free layer oscillates permanently. The oscillation axis can be set utilizing the magnetic anisotropy or local magnetic field. The frequency of the oscillation may be tuned based on the amplitude of the voltage or current applied to the nano-oscillator.

The magnetic direction of the fixed layer of the nano-oscillator may be fixed to a first (e.g., up) direction. When the direction of the free layer of the nano-oscillator is set to the first (e.g., up) direction, the magnetization state of the nano-oscillator may be considered as being in a parallel state. When the direction of the free layer of the nano-oscillator is set to the second (e.g., down) direction, the magnetization state of the nano-oscillator may be considered as being in an anti-parallel state. Accordingly, in response to application of a voltage or current, the nano-oscillator may oscillate somewhere between the parallel and anti-parallel states.

When oscillating, the nano-oscillator generates a spin-polarized current in the spin channel that flows through the spin channel to one or more magnetoresistive devices. The spin-polarized current sets the magnetization states of the one or more magnetoresistive devices, as described above. Similar to the nano-oscillator, these one or more magnetoresistive devices may include a fixed magnetic layer and a free magnetic layer that sandwich an insulator (e.g., nonmagnetic) layer. However, the direction of the free layer of these magnetoresistive devices may not oscillate in response to application of a voltage or current.

Setting the magnetization state of one or magnetoresistive devices may be useful for various applications. As one example, the magnetization states of the magnetoresistive device may indicate a digital value, and the one or more magnetoresistive devices may be formed to function as logical gates (e.g., NOT gates, AND gates, OR gates, etc.). For purposes of illustration, the description is described with respect to the one or more magnetoresistive devices forming logical gates, but the spin pumping techniques utilizing a nano-oscillator, as described in this disclosure, are not limited to logical gates.

FIG. 1 is a block diagram illustrating an example of a spin logic device in accordance with one or more aspects of the present disclosure. Spin logic device 100 may include at least one input device 105, at least one output magnetoresistive device 115, and spin channel 112. Input device 105 may include a Spin Transfer Torque (STT) nano-oscillator 105. In the techniques described in this disclosure, input device 105 may generate a spin current in spin channel 112 through a process known as spin pumping. In some examples, the magnetization state of output magnetoresistive device 115 may indicate a logical value (e.g., 0 or 1) and the magnetization state may be set based on the spin current generated by nano-oscillator 105.

Nano-oscillator 105 and magnetoresistive device 115 are coupled to spin channel 112, all of which are described in more detail below. In some examples, the impedance, or resistivity, of input device 105 may be very different than the impedance of spin channel 112. As a result, there is an impedance mismatch at the boundary between input device 105 and spin channel 112.

In the techniques described in this disclosure, nano-oscillator 105 may be type of a magnetoresistive device with the characteristic that the magnetization state of nano-oscillator 105 oscillates between states in response to a current flowing through nano-oscillator 105. The oscillation of the magnetization state of nano-oscillator 105 induces a spin current in spin channel 112, and the spin current in spin channel 112 sets a magnetization state of magnetoresistive device 115.

In the techniques described in this disclosure, when nano-oscillator 105 is used to generate the spin current, the spin pumping effect induces a spin-current directly into spin channel 112. Because the spin current is induced due to the oscillation of the magnetization state of nano-oscillator 105, the spin current does not interact with the boundary between nano-oscillator 105 and spin channel 112. Accordingly, even if there is an impedance mismatch at the boundary, the creation of the spin current is not affected. Therefore, there may be relative high efficiency in the amount of spin-polarized current injected into spin channel 112.

For instance, in other spin-based logic devices that do not use nano-oscillator 105 and instead rely on a non-oscillating input device, the impedance mismatch between the non-oscillating input device and spin channel 112 makes it difficult to generate a sufficient amount of spin current in the spin channel. For instance, if a non-oscillating input device is used to generate the spin-polarized current that sets the magnetization state for the one or more output magnetoresistive devices, then an impedance mismatch between such a non-oscillating input device and the spin channel inhibits the amount of spin-polarized current that is injected into and that flows through the spin channel.

Furthermore, a spin-polarized current generated from a non-oscillating input device flows through the spin channel to the output magnetoresistive devices due to diffusion. However, there may not be practical ways to control the direction in which the spin-polarized current diffuses meaning that there is a chance that an output magnetoresistive device does not receive the spin-polarized current. Also, the diffusion is comparatively slow, and the amount of time it takes the spin-polarized current to diffuse to the output magnetoresistive device may be too long for high speed spintronic systems.

The spin-polarized current generated by nano-oscillator 105 flows to the magnetoresistive device 115 due to both drift and diffusion forces rather than diffusion alone. The drift force may allow the spin-polarized current to set the magnetization states of the magnetoresistive devices 115 faster than the diffusion, making the spin-polarized current generated by nano-oscillator 105 to be better suited for high speed spintronic systems.

In addition to minimizing the negative effects of impedance mismatch and achieving the benefits of using drift force rather than diffusion, generating the spin current using nano-oscillator 105 may also provide for scalability in generating the spin current. For instance, the size of the nano-oscillator 105 can be scaled for system designs allowing for relatively small sized nano-oscillator 105 to efficiently induce spin current in the spin channel 112 for setting magnetization state of output magnetoresistive device 115.

For example, some other spin pumping techniques use a microwave based coplanar waveguide to excite magnetization dynamics in a magnetoresistive device (i.e., a microwave flowing through the coplanar waveguide induces magnetization dynamics in the magnetoresistive element and injects a spin current in a spin channel). Microwave based coplanar waveguide spin pumping techniques (e.g., waveguide-based spin logic devices) may address the negative effects of impedance mismatch and diffusion. However, microwave based coplanar waveguide devices require a large area, and increasing the amount of spin current requires increasing the length of the waveguide. Thus, waveguide-based spin logic devices require additional devices (e.g., coplanar waveguide), which requires significantly more total area. Waveguide-based spin logic devices also require an external magnetic field to tune the frequency of the spin pumping current. Further, waveguides do not excite magnetization dynamics efficiently (i.e., do no set magnetization states efficiently), thus waveguide-based spin logic devices are not very energy efficient.

The disclosure describes a spin pumping device using nano-oscillator 105, where the spin current induced in spin channel 112 is due to the oscillation of the magnetization state of nano-oscillator 105. Nano-oscillator 105 may require less power and area than waveguide based spin pumping devices. Accordingly, the described spin pumping spin logic device may be more energy efficient than waveguide based devices. The described device may also occupy less chip space than waveguide based spin logic devices, thus allowing more logic devices on the same sized chip. Furthermore, as described above, the described device may not be impacted by the impedance mismatch and may utilize the drift force for setting magnetization state of output magnetoresistive device 115.

As illustrated, nano-oscillator 105 and output magnetoresistive device 115 may be coupled to spin channel 112. Spin channel 112 carries a spin current from the at least one nano-oscillator 105 to the at least one output magnetoresistive device 115. In some examples, spin channel 112 may include Tantalum (Ta), Tungsten (W), or other materials with strong a spin-orbit coupling. In other examples, spin channel 112 may include a topological insulator such as Bi2Se3 or Bi2Te3.

In some examples, nano-oscillator 105 is a type of a magnetoresistive device. Nano-oscillator 105 may include a single magnetic layer, which may include a plurality of magnetic sub-layers. In some examples, nano-oscillator 105 may include a plurality of layers, including fixed magnetic layer 106, non-magnetic layer 108, and free magnetic layer 110. Fixed layer 106 and free layer 110 may each be considered a different side of nano-oscillator 105. Nano-oscillator 105 may include a Spin Current Spin Valve (SCSV). In some examples, an SCSV may include magnetoresistive device with thinner layers than traditional magnetoresistive devices, as described in FIGS. 3A-3C.

Fixed layer 106 may include a ferromagnetic material (e.g., CoFeB). As described below and illustrated in FIGS. 3A-3C, in some examples, fixed layer 106 may include a plurality of sub-layers. Free layer 110 may include a ferromagnetic material (e.g., CoFeB). As described and illustrated in FIG. 3C, in some examples, free layer 110 may include a plurality of sub-layers, which may be exchange coupled.

Non-magnetic layer 108 may be sandwiched between fixed layer 106 and free layer 110. In some examples, non-magnetic layer 108 may include insulating materials such as magnesium oxide (MgO). Non-magnetic layer 108 may be thin enough (approximately 1.0 nanometers) that electrons may tunnel from fixed layer 106 to free layer 110, or vice versa. In some examples, non-magnetic layer 108 may include a tunneling layer (e.g., in an MTJ). In some examples, non-magnetic layer 108 may include a spacer layer (e.g., in a GMR).

Either side of nano-oscillator 105 may be coupled to another device or component. As illustrated in FIG. 1, in some examples, a first side (e.g., fixed layer 106) may be coupled to voltage source ($V_{in}$) 101 and a second side (e.g., free layer 110) may be coupled to spin channel 112.

Fixed layer 106 and free layer 110 may include a magnetization direction. The magnetization direction of fixed layer 106 may be fixed so that the magnetization direction of fixed layer 106 does not change. The magnetization direction of free layer 110 may be changeable, as described below.

Nano-oscillator 105 may include an operation state, such as a parallel (P) magnetization state or an anti-parallel (AP) magnetization state. The operation state of nano-oscillator 105 may depend upon the magnetization direction of fixed layer 106 and free layer 110.

The magnetization orientation of fixed layer 106 and free layer 110 may be in-plane or perpendicular. In examples with in-plane orientation, the magnetization direction of fixed layer 106 and the magnetization of free layer 110 are in the plane of spin channel 112. In examples of perpendicular orientation, also known as out-of-plane, the magnetization direction of fixed layer 106 and the magnetization of free layer 110 are normal to the plane of spin channel 112.

In some examples, output magnetoresistive device 115 may include a plurality of layers including fixed layer 116, non-magnetic layer 118, and free layer 120. In some examples, output magnetoresistive device 115 may be similar to nano-oscillator 105. For instance, fixed layer 116 corresponds to fixed layer 106, non-magnetic layer 118 corresponds to non-magnetic layer 108, and free layer 120 corresponds to free layer 110. However, the magnetization state of output magnetoresistive device 115 may not oscillate in the manner that the magnetization state of nano-oscillator 105 oscillates.

In the techniques described in this disclosure, the magnetization state of output magnetoresistive device 115 represents a digital value (e.g., 0 or 1). For example, the impedance (also referred to as the resistance) of output magnetoresistive device 115 indicates whether the layers of output magnetoresistive device 115 are aligned parallel (P) or anti-parallel (AP). In some examples, if the impedance measurement indicates high impedance, output magnetoresistive device 115 may be aligned anti-parallel, and if the impedance measurement indicates low impedance, output magnetoresistive device 115 may be aligned parallel. The high impedance of output magnetoresistive device 115 may correspond to a digital high, and the low impedance of output magnetoresistive device 115 may correspond to a digital low, or vice-versa. In other words, when the magnetization state of output magnetoresistive device 115 is parallel (i.e., the magnetization directions of fixed layer 116 and free layer 120 is the same), the impedance of output magnetoresistive device 115 may be low. When the magnetization state of output magnetoresistive device 115 is anti-parallel (i.e., the magnetization directions of fixed layer 116 and free layer 120 are opposite), the impedance of output magnetoresistive device 115 may be high. Low impedance of magnetoresistive device 115 may correspond to a digital low and high impedance of magnetoresistive device 115 may correspond to a digital high, or vice-versa.

In operation, the magnetization state of nano-oscillator 105 and the direction of free layer 110 may be set based upon an input voltage $V_{in}$ 101 and its corresponding current 102 (e.g., a direct (DC) current, $I_{in}$). The input voltage causes a current to flow into nano-oscillator 105. The current may excite magnetization dynamics in nano-oscillator 105, such that the magnetization direction of free layer 110 precesses (or oscillates). The oscillation of free layer 110 causes nano-oscillator 105 to oscillate. Since the resistance of nano-oscillator 105 is a function of its magnetization state, the resistance of nano-oscillator 105 oscillates as the magnetization direction of free layer 106 oscillates.

In some examples, spin pumping may occur after only a few precessions of the magnetization dynamics. After sufficient precessions of the magnetization dynamics, spin pumping may cause a spin current to be injected directly into spin channel 112. The Inverse Spin-Hall Effect (ISHE) may separate, based on the spin orbit, the spin up polarized electrons from the spin down polarized electrons, causing the spin up electrons and spin down electrons to scatter in different directions. The drift force may then drive the spin current toward output magnetoresistive device 115. In some examples, the direction of the spin current in spin channel 112 may depend on the direction of the DC current, and reversing the direction of the DC current may reverse the direction of the spin current.

In some examples, nano-oscillator 105 includes an SCSV where free layer 110 is thinner than the free layer in traditional magnetoresistive resistive devices. As the thickness of free layer 110 decreases, the magnitude (also called the absolute value) of the output voltage at output magnetoresistive device 115 exhibits an asymmetric or nonreciprocal behavior for spin currents with a magnetic field having opposite signs but identical absolute value. In other words, two spin currents having identical frequencies but traveling in opposite directions (i.e., traveling through oppositely polarized magnetic fields, e.g., 400 Oe and −400 Oe) will produce output voltages that are different in sign and magnitude. In some examples, when the spin current frequency is approximately 2 GHz and the spin current travels through a −400 Oe magnetic field, the output voltage may be approximately +30 μV; but, when the spin current frequency is approximately 2 GHz and the spin current travels through a −400 Oe magnetic field, the output voltage may be approximately +10 μV. This asymmetric behavior increases with decreasing film thickness.

In the illustrated example of FIG. 1, the spin current with a first spin state (e.g., spin up) polarization flows to the right of nano-oscillator 105 while the spin current with a second spin state (e.g., spin down) polarization flows to the left of nano-oscillator 105; in some examples, the spin current may flow left when polarized as spin up and flow right when polarized as spin down. In the illustrated example, the vertical arrows are the same length throughout spin channel 112, illustrating the fact that the spin current does not diffuse.

As the spin current flows towards through spin channel 112 it may be absorbed by output magnetoresistive device 115. In some examples, when the spin current is absorbed by output magnetoresistive device 115, the magnetization direction of free layer 120 changes. As a result, the magnetization state of output magnetoresistive device 115 may change from P to AP (or vice versa). In some examples, if the spin state of the spin current is a first spin state (e.g., spin down or spin up), then the spin-polarized current sets the magnetization state of output magnetoresistive device 115 to a first state (e.g., parallel or anti-parallel), and if the spin state of the electrons is a second spin state, then the spin-polarized current sets the magnetization state of output magnetoresistive device 115 to a second state.

The magnetization state of output magnetoresistive device 115 may be determined by reading the impedance of output magnetoresistive device 115. In some examples, reading the impedance of output magnetoresistive device 115 may include applying a known voltage and current to output magnetoresistive device 115 and measuring the resistance of output magnetoresistive device 115. For example, if the impedance measurement indicates high impedance, output magnetoresistive device 115 may be aligned anti-parallel, and if the impedance measurement indicates low impedance, output magnetoresistive device 115 may be aligned parallel, or vice-versa. The high impedance of output magnetoresistive device 115 may correspond to a digital high and the low impedance of output magnetoresistive device 115 may correspond to a digital low, or vice-versa.

In some examples, where nano-oscillator 105 includes a SCSV, the output voltage from output magnetoresistive device 115 may exhibit a nonreciprocal behavior. In these examples, reducing the thickness of free layer 110 may allow logic device 100 to output voltages that are different in direction and magnitude by maintaining the magnitude of the DC current but simply changing the direction of the DC current.

In some examples, the magnetization state of output magnetoresistive device 115 may be set based on voltage-controlled magnetic anisotropy (VCMA), strain induced magnetization switching, and/or exchange biasing magnetization switching. For example, a gate voltage (and hence an electric field) may be applied to output magnetoresistive device 115. VCMA may originate from spin-dependent screening of an electric field which leads to changes in the surface magnetization and the surface magnetocrystalline anisotropy. In some examples, the use of VCMA may reduce the amount of spin current required to change the magnetization direction of free layer 120, thus reducing the current and voltage necessary to cause precession in nano-oscillator 105. Reducing the voltage and current applied to nano-oscillator 105 may improve the energy efficiency of logic device 100. In some examples, the gate voltage may also be utilized as a clock signal to synchronize the logic circuit in multi-state logic circuits.

In operation, spin logic device 100 may include three phases: 1) a read phase, 2) a write phase, and 3) a standby phase. During the read phase, spin logic device 100 may determine the magnetization state of output magnetoresistive device 115. In some examples, determining the magnetization state of output magnet 105 may include applying a known voltage and current to output magnetoresistive device 115 and calculating the resistance of the output magnetoresistive device 115.

In some examples, the write phase may include several sub-steps. First, input voltage 101 may be applied to nano-oscillator 105. The current 102 (e.g., a direct (DC) current) corresponding to the input voltage 101 may flow into fixed layer 106 of nano-oscillator 105. The current may excite magnetization dynamics and magnetization precession in free layer 110. After sufficient precessions, spin pumping may occur such that the spin pumping may inject a spin current in spin channel 112. Then, the drift force may drive the spin current through the spin channel 112. Output magnetoresistive device 115 may absorb (e.g., receive) the spin current which may cause the magnetization state of output magnetoresistive device 115 to change. The write phase ends when input voltage 101 is removed from nano-oscillator 105 such that the spin current can no longer flow through the spin channel.

Spin logic device 100 resides in the standby phase when it is not in the read phase or the write phase. In the standby phase, input voltage 101 is removed and free layer 110 of nano-oscillator 105 returns to its preset magnetization direction. Spin logic device 100 then remains in the standby phase until executing either the read phase or write phase.

As illustrated in FIG. 1 and described in more detail, spin logic device 100 comprises a NOT gate. However, other examples may include different logical structures, such as AND, OR, NAND, NOR, etc. As illustrated by the NOT gate in FIG. 1, when input voltage 101 is applied to the nano-oscillator (also denoted by $V_{in}=1$), the input voltage 101 and corresponding input current 102 excites the magnetization dynamics in nano-oscillator 105. Thus, spin pumping occurs when nano-oscillator 105 starts precessing and the magnetization dynamics injects a spin current into spin channel 112. The spin current drifts toward the output magnetoresistive device 115 and output magnetoresistive device 115 absorbs the spin current. As a result, the magnetization state of output magnetoresistive device 115 changes from anti-parallel to parallel. Thus, output magnetoresistive device 115 has a low resistance and output voltage 104 indicates a logical 0 (also denoted by $V_{out}=0$).

When input voltage 101 is removed from nano-oscillator 105 (denoted as $V_{in}=0$), current does not flow to nano-oscillator 105 and the magnetization dynamics in nano-oscillator 105 are not excited. Spin pumping does not occur, nano-oscillator 105 does not precess, and no the spin current is not generated. As a result, the magnetization state of output magnetoresistive device 115 does not change (i.e., it remains in the anti-parallel state). Thus, output magnetoresistive device 115 has a high resistance and output voltage 104 indicates a logical 1 (denoted by $V_{out}=1$).

The described spin pumping spin logic device may include several advantages over current state of the art devices. One possible advantage relates to the size of nano-oscillator 105. Conventional magnetoresistive devices used in memory applications require a minimum thickness of the individual layers (typically, the minimum thickness is approximately 10 nanometers). In contrast, in some examples, the layers of nano-oscillator 105 can be much thinner than traditional magnetoresistive devices because nano-oscillator 105 is not used as memory. Spin-based logic device 100 may also occupy less area than a waveguide-based logic device. This may allow more logic devices 100 to be placed on the same sized chip. Further, spin pumping occurs more easily because nano-oscillator 105 only requires a few short pulses of current to excite magnetization dynamics and cause the magnetization direction to oscillate. As a result, nano-oscillator 105 may require less energy than coplanar waveguide based logic devices, such that logic device 100 may be more energy efficient than waveguide based devices. In addition, the use of spin pumping makes it so that the direction of the spin current can be controlled by directly injecting the spin current into spin channel 112. Thus, spin pumping spin logic device 100 may utilize the asymmetry of the spin current spin valve (SCSV).

Figure 2:
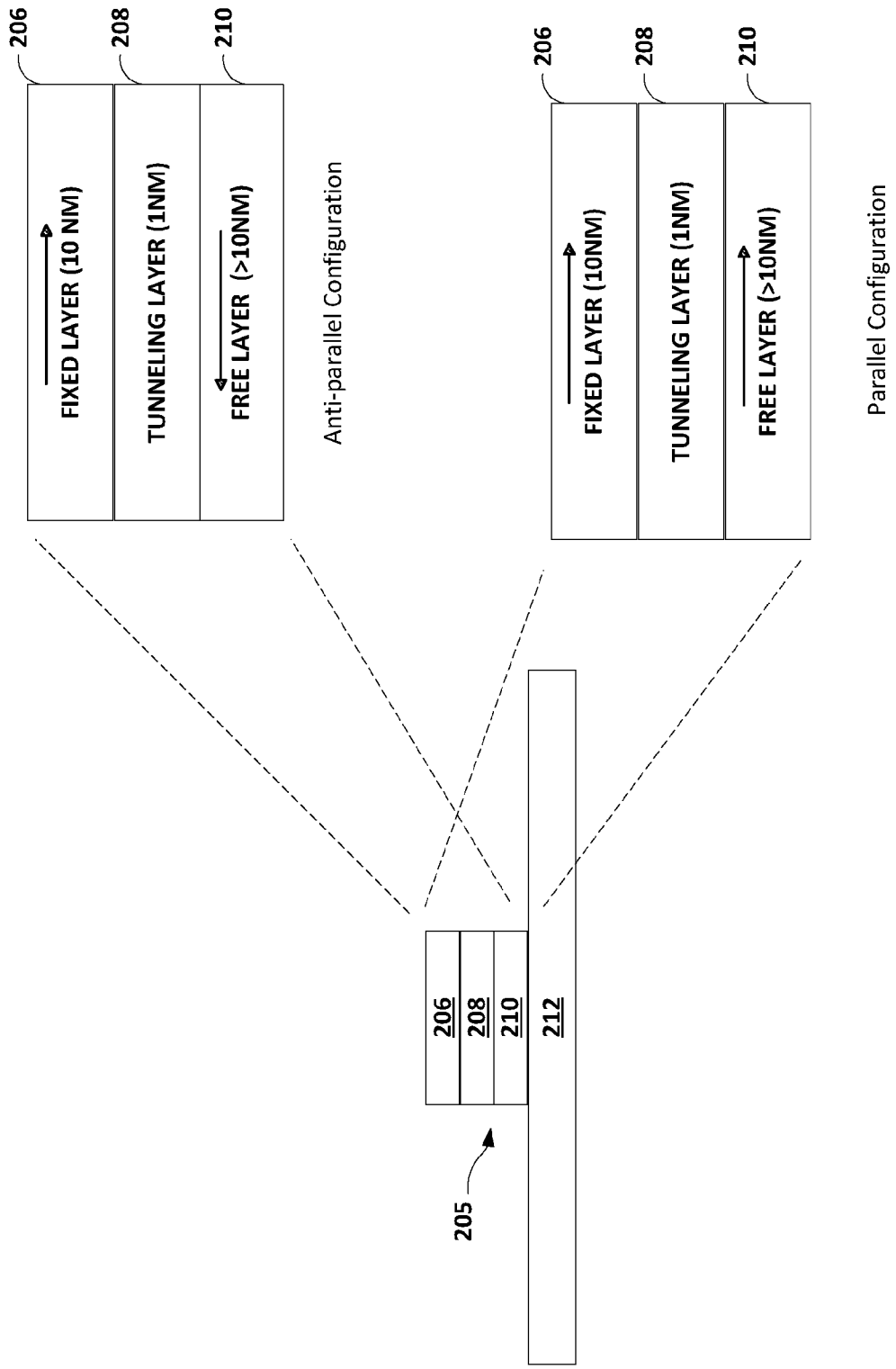
FIG. 2 is block diagrams illustrating an example of a magnetoresistive device.

FIG. 2 is block diagrams illustrating an example of a magnetoresistive device. Magnetoresistive device 205 may include a giant magnetoresistance (GMR) device, a magnetic tunnel junction (MTJ) device, tunneling magentoresistance (TMR) device, or the like. Magnetoresistive device 205 includes a plurality of layers, including fixed layer 206, non-magnetic layer 208, free layer 210, and spin channel 212, as substantially described with reference to FIG. 1 (elements 105, 106, 108, 110, and 112 respectively). Magnetoresistive device 205 includes a magnetization state that is set based on the magnetization directions of fixed layer 206 and free layer 210. The magnetization state of magnetoresistive device 205 may be an anti-parallel configuration or a parallel configuration.

Magnetoresistive devices are often used in memory/storage devices such as magnetoresistive random access memory (MRANI). In storage devices, fixed layer 206 and free layer 210 typically have a minimum thickness between three nanometers and ten nanometers. Thinner layers may improve the energy required to switch the magnetization direction of free layer 210; however, thinner layers may be detrimental to the nonvolatile storage capabilities of magnetoresistive device 205. Nano-oscillators 105 (described above) and 305 (described below) are used for spin pumping. As a result, spin pumping nano-oscillators 105 and 305 can be made much thinner that traditional magnetoresistive device 205. For example, rather than utilizing magnetoresistive device 205 for generating the spin current, the techniques described in this disclosure utilize spin pumping nano-oscillators that are smaller in size, and provide better spin pumping effect as described above.

FIGS. 3A-3C are block diagrams illustrating an example of a nano-oscillator in accordance with one or more aspects of the present disclosure. Nano-oscillator 305 may include a spin pumping effect, which may be used to generate (e.g., induce) a spin current in a spin channel (e.g., element 112 in FIG. 1). Nano-oscillator 305 may include a plurality of layers substantially similar to nano-oscillator 105 as described in FIG. 1. For instance, nano-oscillator 305 may include a fixed layer 306, non-magnetic layer 308, and free layer 310 (elements 105, 106, 108, and 110 respectively). FIGS. 3A-3C illustrate electrode 322 on top of fixed layer 306. In some examples, fixed layer 306 and free layer 310 may each be considered a different side of magnetoresistive device 305. As such, fixed layer 306 and free layer 310 may be thinner than the corresponding layers in conventional magnetoresistive devices. By reducing the thickness of nano-oscillator 305, nano-oscillator 305 may be used for spin pumping. Spin pumping nano-oscillator 305 may be smaller and more energy efficient than other spin pumping methods (e.g., waveguide based devices).

Fixed layer 306 may include a ferromagnetic material (e.g., CoFeB) having a magnetization direction. As illustrated in FIGS. 3A-3C, in some examples, fixed layer 306 may include a plurality of sub-layers. In some examples, the sub-layers may form a Synthetic Antiferromagnetic Structure (SAF).

As illustrated in FIGS. 3A-3C, fixed layer 306 may include an anti-ferromagnetic sub-layer 306A, pinning sub-layer 306B, polarizer sub-layer 306C, and reference ferromagnetic sub-layer 306D. As shown in FIGS. 3A-3C, fixed layer 306 includes four sub-layers; however, fixed layer 306 may include more or fewer sub-layers. As illustrated in FIGS. 3A-3C, the approximate thickness of each layer is given in nanometers.

In some examples, anti-ferromagnetic sub-layer 306A may include an antiferromagnetic layer or synthetic antiferromagnetic material such as Platinum Manganese (PtMn), Iridium Manganese (IrNm), or materials with similar properties. Anti-ferromagnetic sub-layer 306A may include a thickness of approximately 10 nanometers, as illustrated in FIGS. 3A-3C.

Pinning sub-layer 306B may include a magnetic material such as Iron Cobalt (CoFe), Cobalt (Co), [Cobalt (Co)/Pallidium (Pd)] multilayer, or materials with similar properties. In some examples, as illustrated in FIG. 3A, pinning sub-layer 306B may include a thickness of approximately 2.3 nanometers.

Polarizer sub-layer 306C may include Tantalum (Ta), Ruthenium (Ru), or materials with similar properties. As illustrated in FIGS. 3A-3C, in some examples, the thickness of electrode sub-layer 306C may include a thickness of approximately 0.8 nanometers.

Reference ferromagnetic sub-layer 306D may include a ferromagnetic material such a Cobalt Iron Boron (CoFeB) or materials with similar properties. As illustrated in FIGS. 3A-3C, in some examples, sub-layer 306D may include a thickness of approximately 1.2 nanometers to approximately 2.2 nanometers.

As illustrated in FIG. 3C, free layer 310 may include a plurality of sub-layers. In some examples, the plurality of sub-layers may include a ferromagnetic layer 310A and a YIG layer 310B. The plurality of sub-layers may include HS-AOS switchable layer (e.g., switchable based on helicity) and another magnetic layer (e.g., CoFeB, CoFe, etc.) that directly contacts with non-magnetic layer 308. In some examples, the thickness of free layer 310 may be approximately 0.8 nanometers to approximately 6.0 nanometers. In some examples, the thickness of free layer 310 may be approximately 0.8 nanometers to approximately 3.4 nanometers. Sub-layer 310A may include a thickness of approximately 0.8 nanometers to approximately 1.4 nanometers, and sub-layer 310B may include a thickness of approximately 2.0 nanometers. The combined thickness of sub-layers 310A and 310B may approximately 3.4 nanometers. In some examples, the combined thickness of sub-layers 310A and 310B may be approximately 6.0 nanometers. As illustrated in FIG. 3C, free layer 310 includes two sub-layers; however, free layer 310 may include additional sub-layers.

Nano-oscillator 305 may include a magnetization state that is determined by the magnetization directions of fixed layer 306 and free layer 310, as described in FIG. 1. In the techniques described in this disclosure, the magnetization state of nano-oscillator 305 changes or oscillates between states in order to induce a spin current in spin channel 312.

The magnetization orientation of fixed layer 306 and free layer 310 may be in-plane or perpendicular. As illustrated in FIG. 3A, in examples with in-plane orientation, the magnetization direction of fixed layer 306 and the magnetization of free layer 310 are in the plane of conductive channel 312. As illustrated in FIGS. 3B and 3C, in examples of perpendicular orientation, also known as out-of-plane, the magnetization direction of fixed layer 306 and the magnetization of free layer 310 are normal to the plane of conductive channel 312.

In some examples, as illustrated in FIG. 3C, fixed layer 310 may also be coupled to another electrode 324. Applying a voltage or current to electrode 324 may assist in changing the magnetization orientation of free layer 310 from perpendicular to in-plane, which may assist in exciting magnetization dynamics in free layer 310 and generating a spin current in spin channel 312.

Figure 4:
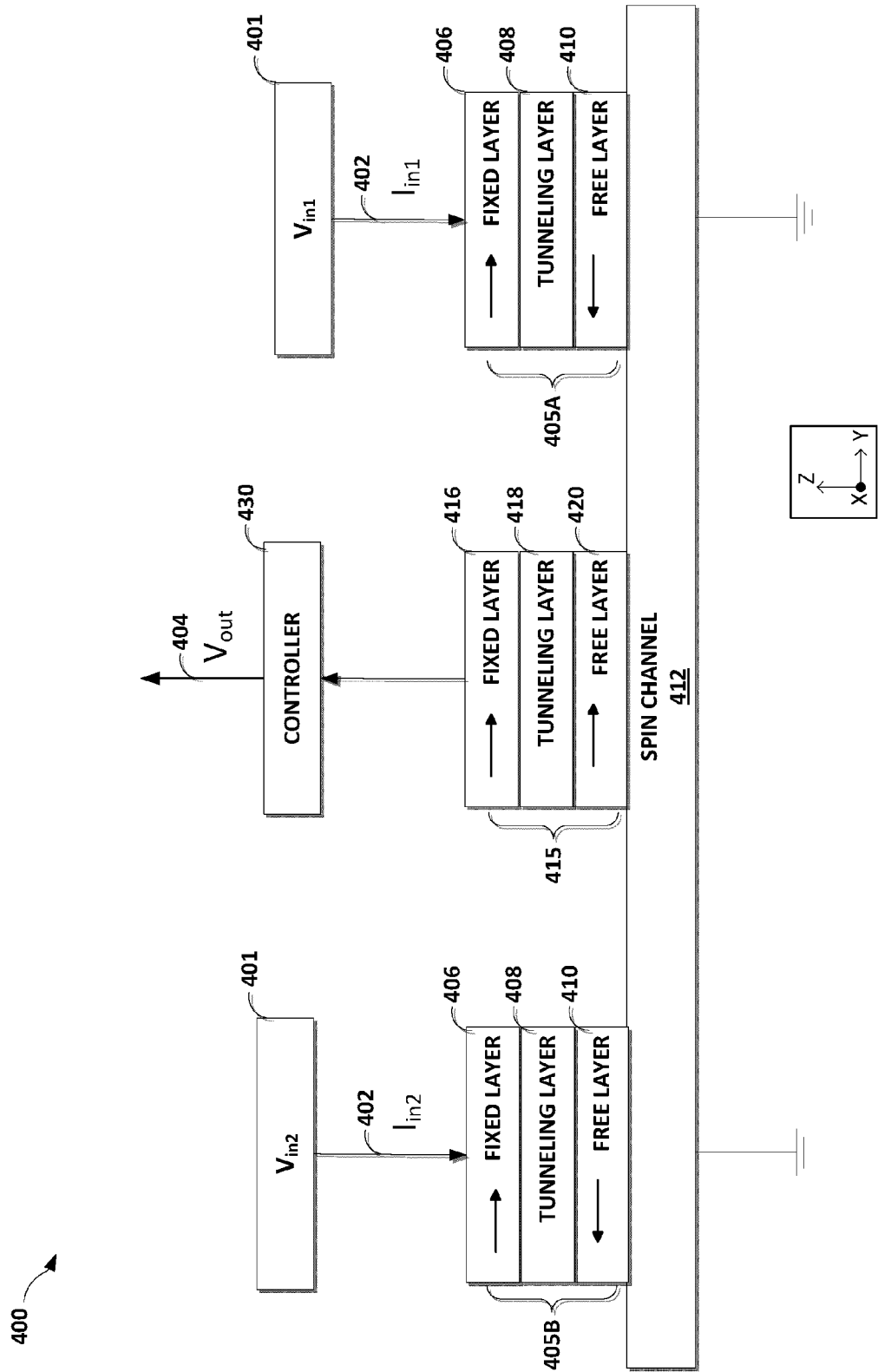
FIG. 4 is a block diagram illustrating an example of a spin logic device in accordance with one or more aspects of the present disclosure.

FIG. 4 is a block diagram illustrating an example of a spin logic device in accordance with one or more aspects of the present disclosure. In some examples, spin logic device 400 may include a plurality of nano-oscillators 405A, 405B (collectively, "nano-oscillators 405"), spin channel 412, and at least one output magnetoresistive device 415, as described in FIG. 1 (elements 105, 112, and 115 respectively). Each nano-oscillator 405 may include a plurality of layers and sub-layers as described in FIGS. 3A-3C (e.g., fixed layer 406, tunneling layer 408, and free layer 410). Each nano-oscillator 405 may be a spin pump and may induce a spin current in spin channel 412. Output magnetoresistive device 415 may include a plurality of layers as described in FIG. 2. In the illustrated example of FIG. 4, spin logic device 400 includes two input nano-oscillators 405A and 405B (collectively, nano-oscillators 405) and a single output magnetoresistive device 415, which includes fixed layer 416, tunneling layer 418, and free layer 420. In the illustrated example, a first nano-oscillator 405A may be initialized in a first magnetization state (e.g., parallel) and a second nano-oscillator 405B may be initialized in a second magnetization state (e.g., anti-parallel). In some examples of a two input logic device, nano-oscillators 405 may have the same initial magnetization state. In some examples, spin logic device 400 may include three or more input nano-oscillators 405. In these examples, each nano-oscillator 405 may be initialized to the same initial magnetization state (e.g., all are parallel or anti-parallel) or at least one nano-oscillator 405 may be initialized to a first magnetization state while at least one nano-oscillator 405 may be initialized to a second magnetization state.

In operation, each of the at least one nano-oscillators 405 may be used as a separate spin pump to generate a spin current as described in FIG. 1. An input voltage 401 or input current 402 may be applied to one side of the at least one nano-oscillator 405, causing nano-oscillator 405 to excite magnetization dynamics in free layer 410. When the magnetization dynamics are excited, free layer 410 oscillates between magnetization states and a spin current may be generated in spin channel 412. The spin current may flow through spin channel 412 and may be absorbed (e.g., received) by output magnetoresistive device 415 as described in FIG. 1. As a result, the magnetization state of output magnetoresistive device 415 may switch from a first magnetization state to a second magnetization state. In the illustrated example, whether the magnetization state of output magnetoresistive device 415 changes may depend on the operation of nano-oscillators 405A and 405B.

In some examples, spin logic device 400 may include a controller 430. Controller 430 may apply a known voltage and current to output magnetoresistive device 415 to determine the resistivity or impedance of output magnetoresistive device 415. The resistivity of output magnetoresistive device 415 may correspond to a digital value. For example, when the magnetization state of output magnetoresistive device 115 is parallel (i.e., the magnetization directions of fixed layer 116 and free layer 120 is the same), the impedance of output magnetoresistive device 115 may be low. When the magnetization state of output magnetoresistive device 115 is anti-parallel (i.e., the magnetization directions of fixed layer 116 and free layer 120 are opposite), the impedance of output magnetoresistive device 115 may be high. In some examples, when the magnetization state is parallel the impedance may be high and when the magnetization state is anti-parallel the impedance may be low. Low impedance of magnetoresistive device 115 may correspond to a digital low and high impedance of magnetoresistive device 115 may correspond to a digital high, or vice-versa. Thus, controller 430 may output an output voltage $V_{out}$ 404 that represents a digital value based on the measured impedance of output magnetoresistive device 415.

As illustrated in FIG. 4, in operation, $V_{out}$ 404 may be a function of $V_{in1}$ 401 and $V_{in2}$ 401, which are given the same reference numeral to indicate that they may be similar, as well as the initial magnetization configuration of the layers 410 and 420. As illustrated, $V_{in1}$ and $V_{in2}$ output respective currents $I_{in1}$ and $I_{in2}$ 402. Assuming that all the fixed layers (406 and 416) are toward right and free layer 410 and 420 point toward left and right, respectively. In this case, magnetoresistive devices 405A and 405B are in antiparallel state (high resistive state) and device 415 (output) is in parallel state (low resistive state). Application of either of input voltages 401 injects spin current into the channel 412 and may switch magnetoresistive device 415 into high resistive state. The Boolean logic may be represented by the following equation (for the configuration given in FIG. 4):

$$V_{out} = V_{in1} + V_{in2}$$

which is an OR gate.

The following table shows the relationships between $V_{in1}$, $V_{in2}$, and $V_{out}$ for the example gate illustrated in FIG. 4:

| $V_{in1}$ | $V_{in2}$ | $V_{out}$ |
|---|---|---|
| 1 | 1 | 1 |
| 1 | 0 | 1 |
| 0 | 1 | 1 |
| 0 | 0 | 0 |

When the $V_{in1}$ and $V_{in2}$ are at state zero, the output voltage $V_{out}$ is preserved at low resistive state.

In other words, when the $V_{in1}$ is a logical high ($V_{in1}=1$), the magnetization dynamics in nano-oscillator 405A are excited and the magnetization state of nano-oscillator 405A begins to oscillate. The oscillation produces a spin current in spin channel 412 that flows from nano-oscillator 405A to output magnetoresistive device 415. Likewise, if $V_{in2}$ is a logical high ($V_{in2}=1$), the magnetization dynamics in nano-oscillator 405B are excited and the magnetization state of nano-oscillator 405B begins to oscillate. The oscillation produces a spin current in spin channel 412 that flows from nano-oscillator 405B to output magnetoresistive device 415. Output magnetoresistive device 415 absorbs the spin current from either of nano-oscillators 405A and 405B. The current density from either of oscillator is large enough to switch the free layer of device 415. As a result, the magnetization state of magnetoresistive device 415 may change such that $V_{out}$ for spin logic device 400 is a logical high state ($V_{out}=1$).

By combining the NOT gate in FIG. 1 and the gate shown here (OR), it is possible to implement any Boolean expression. For example, the techniques described in this disclosure may be extendable for different types of logic gates such as AND gates, NAND gates, XOR gates, etc.

One of the advantages of the magnetoresistive based logic is its reconfigurability. The initial magnetization state of the individual free layers 410 of devices 405A and B as well as the output free layer 420 can be independently defined before logic operation. This phase is usually called as logic programing and sometimes these devices are named as field programmable logic devices (FPLD). For example, by putting the output free layer 420 of the magnetoresistive device 415 into antiparallel state similar to free layer 410 of the input devices 405A and 405B, the output state is not affected by the inputs.

Figure 5:
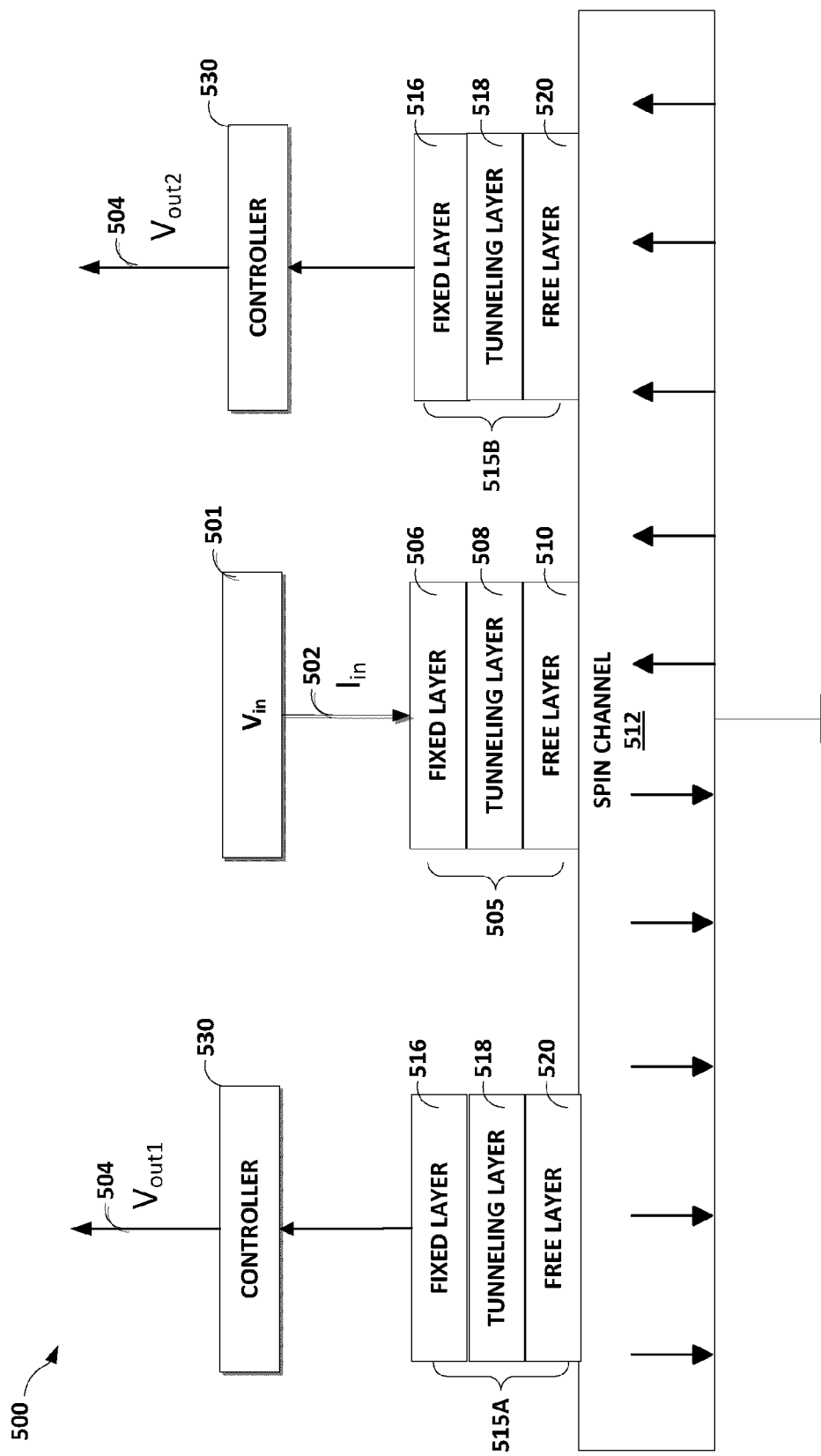
FIG. 5 is a block diagram illustrating an example of a spin logic device in accordance with one or more aspects of the present disclosure.

FIG. 5 is a block diagram illustrating an example of a spin logic device in accordance with one or more aspects of the present disclosure. In some examples, spin logic device 500 may include at least one nano-oscillator 505 and a plurality of output magnets 515. Nano-oscillator 505 and output magnetoresistive device 515 may include a plurality of layers as described in FIG. 1. In the illustrated example of FIG. 5, spin logic device 500 includes one nano-oscillator 505 and two output magnetoresistive devices 515A and 515B (collectively, magnetoresistive devices 515) that each include fixed layer 516, tunneling layer 518, and free layer 520. By applying an input voltage 501 ($V_{in}$) or input current 502 ($I_{in}$) to nano-oscillator 505, which includes fixed layer 506, tunneling layer 508, and free layer 510, the magnetization state of nano-oscillator 505 may oscillate between magnetization states (e.g., parallel and anti-parallel states). This oscillation of the magnetization states induces a spin current in spin channel 512 that drifts through spin channel 512 due to the drift force, rather than traveling through spin channel 512 due to diffusion. If the spin current is polarized spin up electrons, the spin up current may flow one direction. If the spin current is polarized with spin down electrons, the spin down current may flow in another direction. Thus, nano-oscillator 505 may selectively change the magnetization state of output magnetoresistive device 515A or 515B, depending on the direction of the spin current.

In some examples, spin logic device 500 includes at least one controller 530. Controller 530 may apply a known voltage and current to each output magnetoresistive device 515 and determine the resistivity or impedance of each output magnetoresistive device, as described with reference to FIG. 4 (e.g., based on the outputs $V_{out1}$ 504 and $V_{out2}$ 504). Based on the measured resistivity, controller 530 may output a digital value that corresponds to the resistivity of magnetoresistive device 515. The illustrated example includes separate controllers for each output magnetoresistive device 515; however, a single controller 530 may determine the resistivity two or more output magnetoresistive devices 515 and output digital values that correspond to the measured resistivity of each of the respective output magnetoresistive devices 515.

Figure 6:
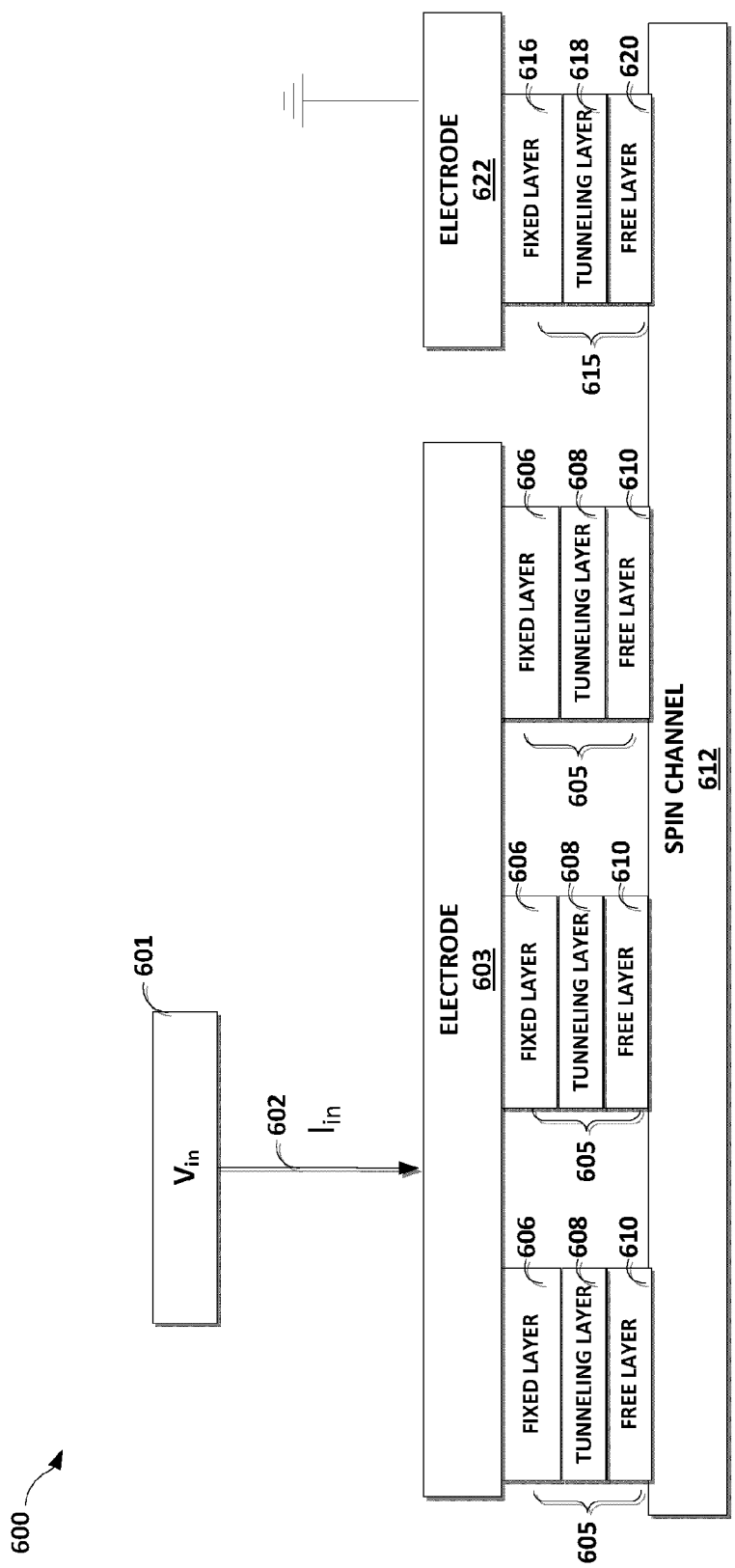
FIG. 6 is a block diagram illustrating an example of a spin logic device in accordance with one or more aspects of the present disclosure.

FIG. 6 is a block diagram illustrating an example of a spin logic device in accordance with one or more aspects of the present disclosure. In some examples, spin logic device 600 may include at least one nano-oscillator 605, spin channel 612, and at least one output magnetoresistive device 615, as described above. FIG. 6 illustrates three nano-oscillators 605 each including fixed layer 606, tunneling layer 608, and free layer 610, with electrode 603 coupled to fixed layer 606. In the illustrated example of FIG. 6, spin logic device 600 includes a plurality of nano-oscillators connected in series, thus spin logic device 600 acts as a majority gate. While three nano-oscillators 605 are shown in the illustrated example of FIG. 6, in general, a majority gate may include any number of nano-oscillators 605 so long as there are at least two nano-oscillators 605. In a majority gate, the output value returns a true if and only if more than 50% of the inputs are true. In the illustrated example, spin current in spin channel 612 may cause the magnetization state of output magnetoresistive device 615 to change based on the magnetization states of the nano-oscillators 605. In some examples, when the input voltage 601 ($V_{in}$) and corresponding current 602 ($I_{in}$) excites magnetization dynamics in a majority of the plurality of nano-oscillators, the excited nano-oscillators may generate sufficient spin current in spin channel 612 to cause output magnetoresistive device 615 to change magnetization states (e.g., from AP to P or vice versa). As illustrated, magnetoresistive device 615 includes fixed layer 616, tunneling layer 618, and free layer 620. Electrode 622 is coupled to fixed layer 616.

Figure 7B:
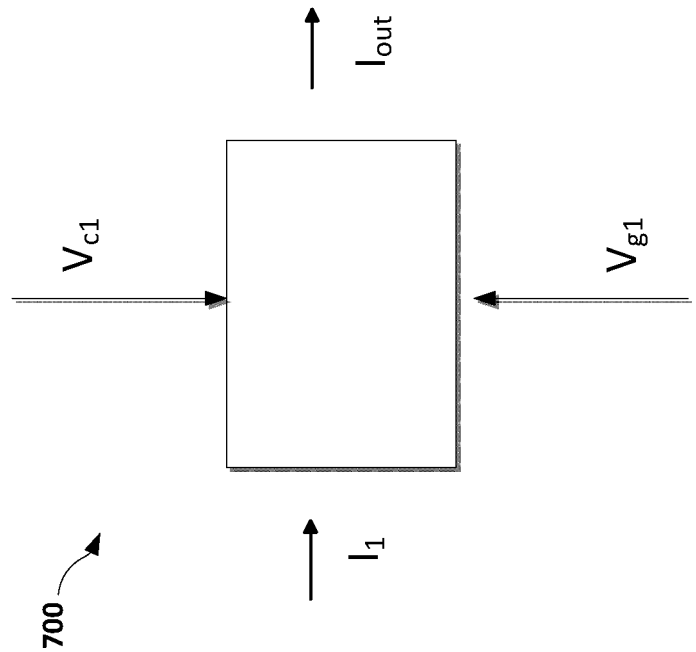
FIGS. 7A-7B are block diagrams illustrating an example of a spin logic device in accordance with one or more aspects of the present disclosure.
Figure 7A:
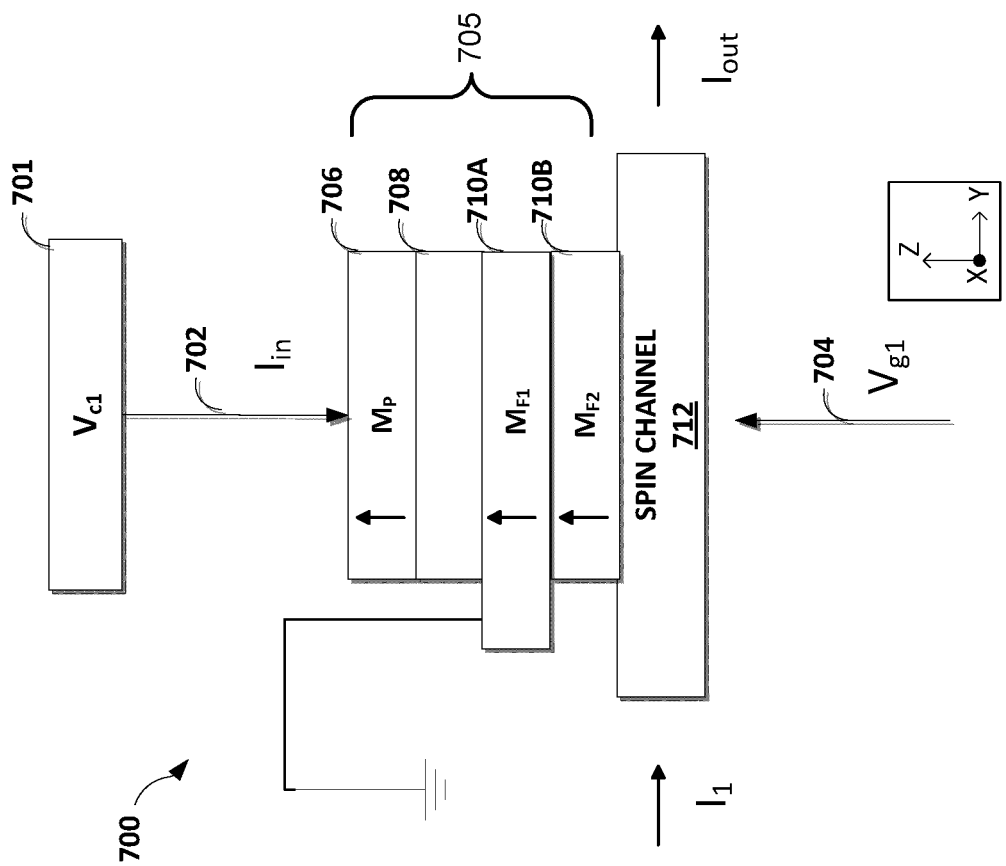

FIGS. 7A and 7B are block diagrams illustrating an example of a nano-oscillator in accordance with one or more aspects of the present disclosure. In some examples, nano-oscillator 705 includes a Spin Current Spin Valve (SCSV). SCSV 700 may include a plurality of layers substantially as described in FIG. 3C. For instance, fixed layer 706 ($M_P$) corresponds with fixed layer 306, non-magnetic layer 708 corresponds with non-magnetic layer 308, and free layers 710A and 710B ($MF_1$, $MF_2$, respectively) together correspond with free layer 310. Fixed layer 706 and free layer 710 may include a plurality of sub-layers, as described in FIG. 3C. In the illustrated example, the magnetization orientation of fixed layer 706 and free layer 710 is shown in the perpendicular orientation. As also illustrated, voltage source 701 ($V_{c1}$) outputs current 702 ($I_{in}$).

In operation, nano-oscillator 705 may operate in a similar as described in FIG. 1. In some examples, SCSV 700 may include a voltage or exchange bias controlled gate between nano-oscillator 705 and an output magnetoresistive device. A gate voltage $V_{g1}$ 704 may be applied to the spin channel 712, causing free layer 710 to transition from perpendicular orientation to in-plane orientation. Input current $I_1$ may be applied to fixed layer 706 causing precession of the magnetization direction of free layer 710. As free layer 710 precesses, spin current may be injected directly into spin channel 712. The drift and diffusion forces may cause the spin current to flow through spin channel 712, which may change the magnetization state of an output magnetoresistive device (not shown).

In some examples, SCSV 700 may act as a NOT or PASS gate with a gate control and device configuration is in such a way that may be easily used in cascaded devices such as a ring oscillator. For example, as given in FIG. 7A, magnetoresistive device 705 may perform oscillations only when $V_{c1}$ is present. If $V_{c1}=0$, the input current $I_1$ in spin channel 712 may be absorbed by free layer 710B such that $I_{out}=0$. When $V_{c1}=1$, free layer 710B may oscillate such that $I_{out}=I_1$. In some examples, a gate voltage $V_{g1}$ may be applied to magnetoresistive device 705, which may bring the magnetization $MF_2$ from out-of-plane into the plane direction. Thus, free layer 710B may begin spin pumping and may inject a spin current into the channel 712 such that $I_{out}$ may be greater than $I_1$. In this example configuration, SCSV device 700 may provide gain on the input current ($I_1$), where a voltage $V_{g1}$ is applied to spin channel 712, as illustrated.

In some examples, an SCSV device 700 may be used as a ring oscillator. One condition for a ring oscillator is having a gate with a gain above one. By applying a gate voltage $V_{g1}$ magnetoresistive device 705, SCSV 700 may amplify $I_1$ such that $I_{out}$ is greater than $I_1$. In some examples, if $V_{g1}$ is not present, SCSV 700 does not amplify the signal. Instead, SCSV 700 acts as a nano-oscillator of the above examples and $I_{out}=I_1$.

Figure 8:
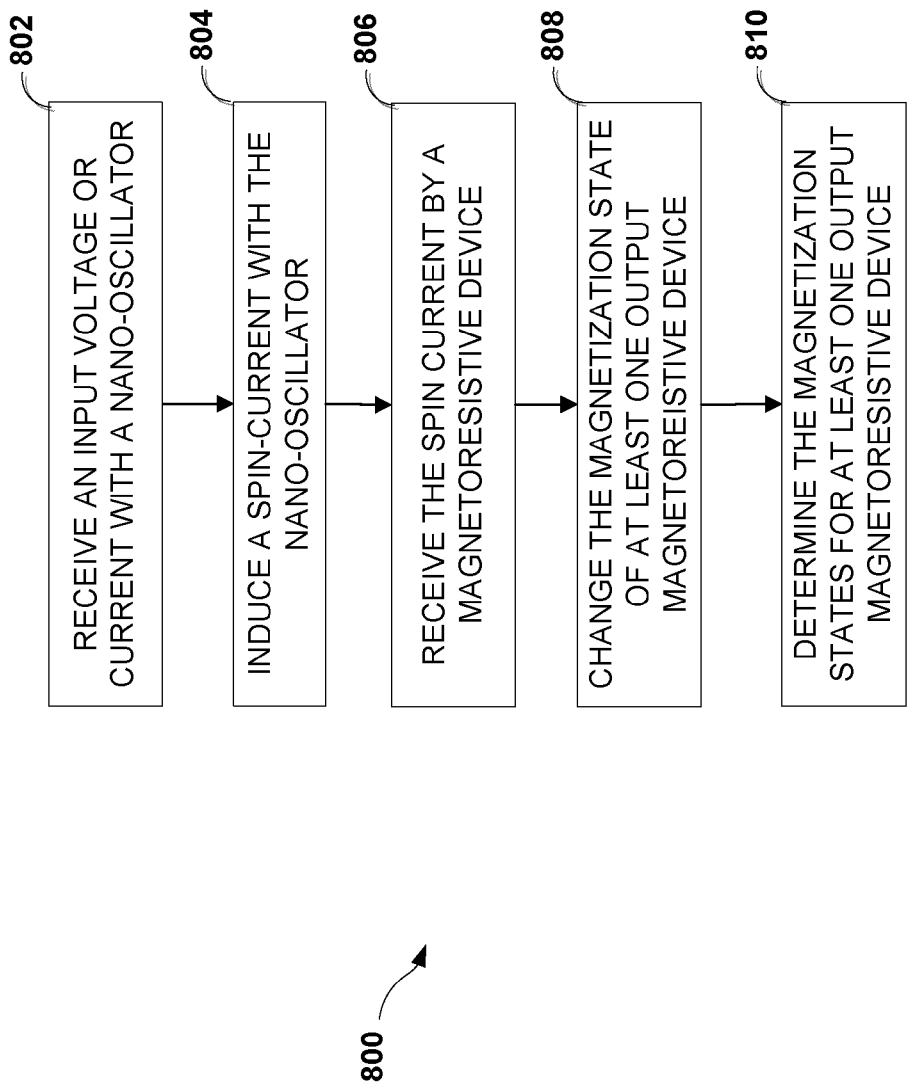
FIG. 8 is a flowchart illustrating operation of an example spin-based logic device in accordance with one or more aspects of the present disclosure.

FIG. 8 is a flowchart illustrating operation 800 of an example spin-based logic device in accordance with one or more aspects of the present disclosure. For purposes of illustration only, the method of FIG. 8 will be explained with reference to the example spin logic device described in FIG. 1; however, the method may apply to other examples.

In some examples, spin logic device 100 may include nano-oscillator 105, spin channel 112, and output magnetoresistive device 115. Nano-oscillator 105 may receive an input voltage or current (802). For example, an external source may apply an input voltage or current to nano-oscillator 105. The input voltage or current may excite magnetization dynamics in nano-oscillator 105 causing the magnetization state of nano-oscillator 105 to oscillate (e.g., AP to P, or P to AP).

After sufficient oscillations, nano-oscillator 105 may begin spin pumping (804). Spin pumping induces a spin current in spin channel 112. In other words, a spin-current is induced by nano-oscillator 105. In some examples, the voltage or current applied to nano-oscillator 105 may be removed once the spin current is induced in spin channel 112; however, the techniques described in this disclosure are not so limited. The spin current may flow through spin channel 112 due to diffusion.

Output magnetoresistive device 115 may absorb or receive the spin current from spin channel 112 (806). As a result, the magnetization state of output magnetoresistive device 115 may change from AP to P, or vice versa (808).

The magnetization state of output magnetoresistive device 115 may be determined (810). The magnetization state may be determined by applying a known voltage and current to output magnetoresistive device 115 and measuring the resistance of output magnetoresistive device 115.

Figure 9:
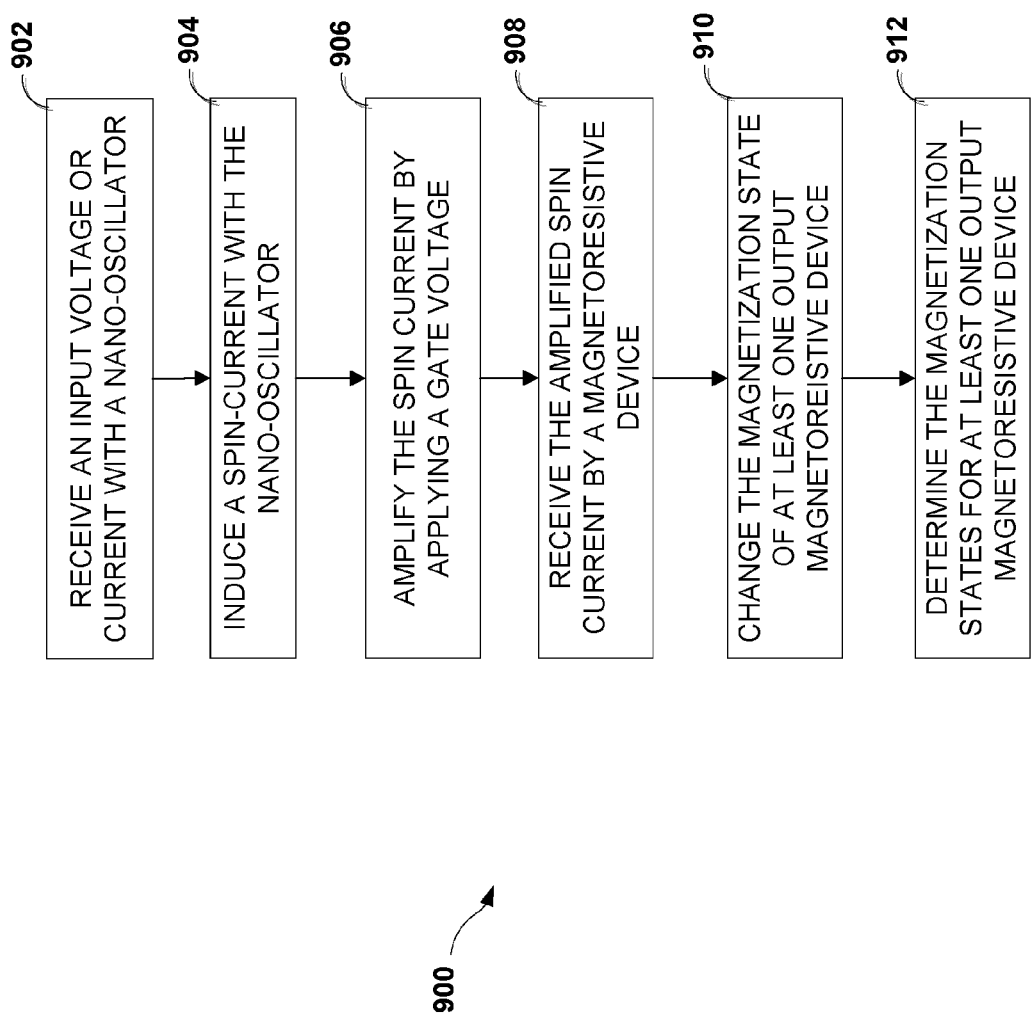
FIG. 9 is a flowchart illustrating operation of an example spin-based logic device in accordance with one or more aspects of the present disclosure.

FIG. 9 is a flowchart illustrating operation 900 of an example spin-based logic device in accordance with one or more aspects of the present disclosure. For purposes of illustration only, the method of FIG. 9 will be explained with reference to the example spin logic device described in FIGS. 7A and 7B; however, the method may apply to other examples.

As described above with reference to FIG. 7A and 7B, nano-oscillator 705 may receive an input voltage or current (902). The input voltage or current may excite magnetization dynamics in nano-oscillator 705 causing the magnetization state of nano-oscillator 705 to oscillate (e.g., AP to P, or P to AP). After sufficient oscillations, nano-oscillator 705 may begin spin pumping (904).

A gate voltage ($V_{g1}$) may be applied to spin channel 712 causing free layer 710 to transition from a perpendicular orientation to an in-plane orientation. As described above in FIGS. 7A and 7B, when the gate voltage is applied, the current through the spin channel is amplified such that $I_{out}$ is greater than $I_1$ (906). In some examples, the $I_{out}$ current may be an input into a stage of a ring oscillator.

An output magnetoresistive device may absorb or receive the amplified spin current from spin channel 712 (908). For example, the output magnetoresistive device may be part of a ring oscillator. As a result, the magnetization state of the output magnetoresistive device may change from AP to P, or vice versa (910). The magnetization state of the output magnetoresistive device may be determined (912). The magnetization state may be determined by applying a known voltage and current to the output magnetoresistive device and measuring the resistance of the output magnetoresistive device.

In some examples, such as those described with respect to FIGS. 7A, 7B, and 9, an output magnetoresistive device may not be necessary in every example. For instance, the $I_{out}$ current, which is generated from the $I_1$ current and the induced spin current (which causes $I_{out}$ to be greater than $I_1$), may be an input current into additional circuitry and is not necessarily limited to being absorbed by an output magnetoresistive device. However, in some examples, the $I_{out}$ current may be absorbed by an output magnetoresistive device, and because the $I_{out}$ current is greater than the $I_1$ current, the magnetization state of the output magnetoresistive device may be set faster.

Various embodiments of the invention have been described. These and other embodiments are within the scope of the following claims.

What is claimed is:

1. A method comprising:
    applying DC input voltage or current to a nano-oscillator to oscillate a magnetization state of the nano-oscillator between a first state and a second state and induce a spin current in a spin channel coupled to the nano-oscillator;
    applying a gate voltage or current to the spin-channel to amplify an input current received by the spin channel with the spin current; and
    outputting the amplified current.

2. The method of claim 1, wherein applying the DC input voltage or current further comprises exciting magnetization dynamics in the nano-oscillator, wherein the oscillation of the nano-oscillator between the first state and the second state induces the spin current, and wherein the spin current drifts through the spin channel.

3. The method of claim 2, wherein the exciting magnetization dynamics is further based on one or more of voltage-controlled magnetic anisotropy (VCMA), strain induced magnetization switching, or exchange biasing magnetization switching.

4. The method of claim 1, wherein the nano-oscillator comprises a magnetoresistive device, the magnetoresistive device comprising one of:
    a single magnetic layer; or
    multiple layers including a fixed magnetic layer, a free magnetic layer, and a non-magnetic layer.

5. The method of claim 4, wherein the thickness of the single magnetic layer or the free magnetic layer is between approximately 0.8 nanometers and approximately 6.0 nanometers.

6. A device comprising:
    a nano-oscillator;
    a spin channel coupled to the nano-oscillator, the spin channel configured to receive an input current and output amplified current;
    a first source configured to apply DC input voltage or current to the nano-oscillator to oscillate a magnetization state of the nano-oscillator between a first state and a second state and induce a spin current in the spin channel; and
    a second source configured to apply a gate voltage or current to the spin-channel to amplify the input current received by the spin channel with the spin current to generate the amplified current.

7. The device of claim 6, wherein the nano-oscillator comprises a magnetoresistive device, the magnetoresistive device comprising one of:
    a single magnetic layer; or
    multiple layers including a fixed magnetic layer, a free magnetic layer, and a non-magnetic layer.

8. The device of claim 7, wherein the thickness of the single magnetic layer or the free magnetic layer is between approximately 0.8 nanometers and approximately 6.0 nanometers.

9. The device of claim 6, wherein the oscillation of the nano-oscillator between the first state and the second state is further based on one or more of voltage-controlled magnetic anisotropy (VCMA), strain induced magnetization switching, or exchange biasing magnetization switching.

10. The device of claim 6, wherein the oscillation of the nano-oscillator between the first state and the second state induces the spin current, wherein the spin current drifts through the spin channel from the nano-oscillator.

* * * * *